United States Patent [19]
Staudinger et al.

[11] Patent Number: 5,303,418
[45] Date of Patent: Apr. 12, 1994

[54] HIGH ISOLATION MIXER

[75] Inventors: Joseph Staudinger; William B. Beckwith, both of Chandler, Ariz.

[73] Assignee: Motorola, Inc., Schaumburg, Ill.

[21] Appl. No.: 719,202

[22] Filed: Jun. 21, 1991

[51] Int. Cl.⁵ ............................................. H04B 1/26
[52] U.S. Cl. .................................. 455/326; 455/318; 455/330
[58] Field of Search ........ 455/118, 319, 320, 325–328, 455/330–333, 302; 329/300, 302; 332/117

[56] References Cited

U.S. PATENT DOCUMENTS

| 3,681,697 | 8/1972 | Moroney | 455/302 X |
| 3,831,097 | 8/1974 | Neuf | 455/302 X |
| 4,677,691 | 6/1987 | Scott | 455/326 X |
| 4,896,374 | 1/1990 | Waugh et al. | 455/327 X |

Primary Examiner—Reinhard J. Eisenzopf
Assistant Examiner—Edward Urban
Attorney, Agent, or Firm—Frederick M. Fliegel; Robert M. Handy

[57] ABSTRACT

A method and apparatus for improved isolation of IF, LO, and RF frequency signals from the non-associated mixer ports (e.g., avoiding introducing RF frequency signals at the IF and LO ports, and similarly vis-a-vis other signals and ports), is provided by coupling a RF (or LO) signal to first ports of four-port first and second phase shift means, each having two signal output ports having 180° phase difference for signals input from the first port, coupling the LO (or RF) signal to the first port of a third phase shift means, with two output signal ports having a phase difference of 180°, supplying the third phase shift means output signals to fourth ports of the first and second phase shift means, supplying the output signals of the first and second phase shift means to distinct ports of a five port mixer, and coupling an IF signal from the five port mixer to an IF port.

23 Claims, 3 Drawing Sheets

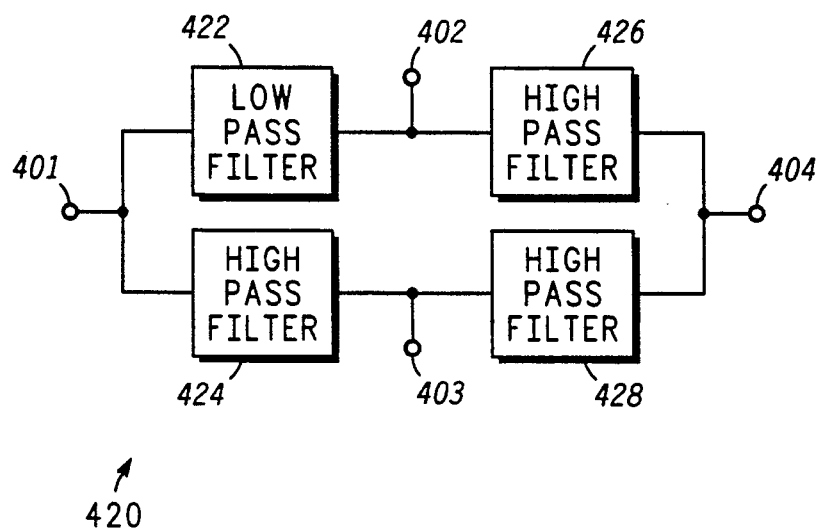
FIG.4
FIG.5
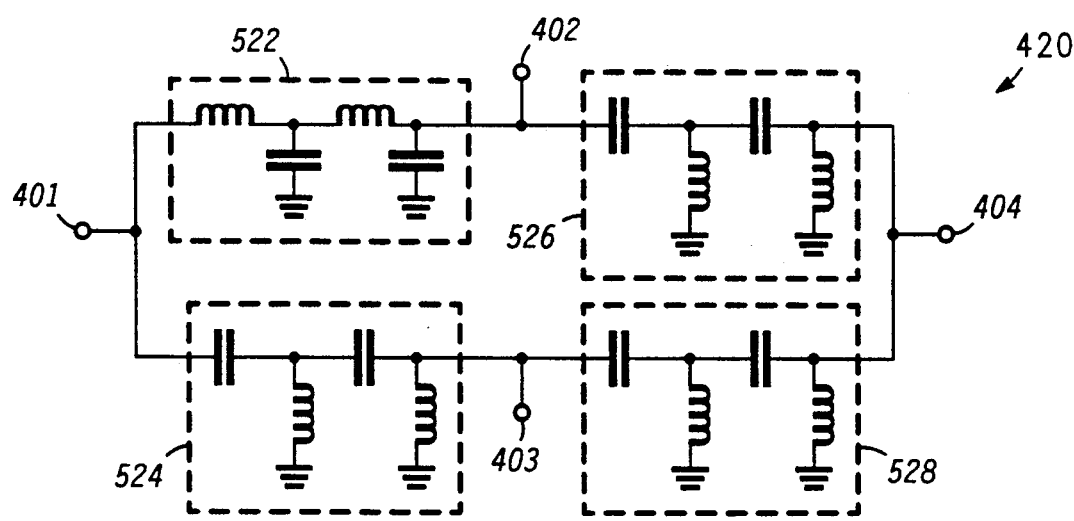

HIGH ISOLATION MIXER

LICENSE RIGHTS

The U.S. Government has a paid-up license in this invention and the right in limited circumstances to require the patent owner to license others on reasonable terms as provided for by the terms of a contract with the U.S. Government.

CROSS-REFERENCE TO RELATED APPLICATION

This application, is related to co-pending application Ser. No. 07/718,726 entitled "Intermediate frequency independent star mixer," which is assigned to the same assignee as the present application.

FIELD OF THE INVENTION

The present invention concerns an improved means and method for mixing electrical signals.

BACKGROUND OF THE INVENTION

It is commonplace in the electronic art to combine a modulated or modulating signal with a local oscillator signal in order to obtain a further modulated signal at another frequency that is more easily amplified, filtered, broadcast and/or detected. This is done in a mixer.

In a typical demodulation application, a modulated radio frequency (RF) signal is combined in a mixer with a local oscillator (LO) signal to produce an intermediate frequency (IF) signal which may be then further amplified and detected to recover the information modulated onto the RF carrier. Alternatively, this process can be reversed, mixing an LO signal with an IF signal to produce a modulated carrier (RF) signal for further amplification and ultimate transmission as a modulated output signal.

The demodulation mixing process produces sum and differences of the RF and LO frequencies. One or more of the sum and difference frequencies is at the desired IF frequency, according to the following relations:

(1) $f_{IF}=f_{LO}-f_{RF}$, i.e., down conversion where $f_{LO}>f_{RF}$, (2) $f_{IF}=f_{RF}-f_{LO}$, i.e., down conversion where $f_{LO}<f_{RF}$, (3) $f_{IF}=f_{LO}+f_{RF}$, i.e. up conversion.

Similar relations apply to modulation of a carrier signal.

Examination of equations (1) and (2) shows that there is not a unique correspondence between $f_{LO}$, $f_{IF}$, and $f_{RF}$. For a given value of $f_{LO}$, two different values of $f_{RF}$ may produce the same value of $f_{IF}$. For example, (see FIG. 1) for $f_{LO}=3$ GigaHertz, both $f_{RF1}=2.5$ GigaHertz and $f_{RF2}=3.5$ GigaHertz can produce $f_{IF}=0.5$ GigaHertz. The RF and IF frequencies are generally not discrete frequencies but narrow frequency bands determined by the modulation thereon. The LO frequency is typically sharply defined, but may be time varying in some cases.

A prior art double balanced mixer apparatus 10 is illustrated in FIG. 2. Mixer apparatus 10 comprises RF port 12, LO port 42, IF port 15, balun transformers 16, 40, and four port mixer element 19 comprising diodes 32, 34, 36, 38, and having input ports 24, 26, 28, 30. Signals 14, 18, 20, 44, 46, 48 are present in mixer apparatus 10. RF input signal 14 comprising either or both RF1 and RF2 enters at RF port 12. Balun transformer 16 splits incoming signal 14 into two substantially equal amplitude RF signals 18, 20 which have a relative phase displacement of 180°. Signal 18 is sent to port 24 of four port mixer element 19 and signal 20 is sent to port 28 of mixer element 19. Similarly, LO port 42 supplies LO signal 44 to balun transformer 40. Balun transformer 40 splits LO signal 44 into two substantially equal amplitude RF signals 46, 48 having a 180° relative phase displacement. Signal 46 is sent to port 26 of four port mixer element 19 and signal 48 is sent to port 30 of four port mixer element 19.

The nonlinear current versus voltage characteristics of diodes 32, 34, 36, 38 cause signals to be created at frequencies in accordance with EQS. 1-3, which signals are coupled to IF port 15 via balun transformer 16. Because balun transformers 16, 40 must be able to pass the RF, LO, and IF frequencies, the required bandwidth of the balun transformers is more difficult to realize.

Alternatively, mixers are employed for modulation of an LO signal by an IF signal to produce a modulated carrier, or RF signal. This process is similar to the demodulation process described above, with LO port 42 and IF port 15 accepting input signals and RF port 12 providing an output signal.

Prior art double-balanced high isolation mixers have a number of disadvantages well known in the art. Among these disadvantages are, for example: (1) inadequate port-to-port isolation, (2) relative complexity, (3) difficulty of implementation in compact form, suitable for incorporation in monolithic microwave integrated circuits (MMIC's), and (4) difficulty in providing wide-bandwidth baluns.

MMIC's are typically constructed using Si, GaAs, or other compound or elemental semiconductor integrated circuit (IC) wafer processing technology on and/or in such wafers. It is highly desirable to have high isolation mixers which can be made with lumped elements or other structures that are compatible with IC fabrication techniques and geometries. In particular, it is important that they be of comparatively small size so as to not occupy disproportionately large substrate areas compared to the semiconductor diodes, transistors, etc., which mix the signals, or compared to the amplifiers or other signal processing elements that may be included in the MMIC. Such concerns are especially important in the frequency range from about 1 to 15 GigaHertz and above where the sizes of distributed circuit elements are unwieldy.

Thus, there continues to be a need for improved high isolation mixers and methods, especially those that use few components, are easy to construct and/or which employ elements that are readily integratable in and/or on MMIC's or the like. As used herein, the term "high isolation" is intended to refer to mixers that minimize or avoid coupling the RF frequency signal to the IF and LO ports, and similarly vis-a-vis the remaining signals and ports.

SUMMARY OF THE INVENTION

Improved isolation of IF, LO, and RF frequency signals from non-associated mixer ports is provided by a method comprising coupling a RF (or LO) signal to first ports of four-port first and second phase shift means each having second and third ports providing signal outputs having a phase difference of 180° for signals input from the first port, coupling the LO (or RF) signal to the first port of a third phase shift means with second and third ports providing output signals having a phase difference of 180°, supplying the output signals of the third phase shift means to fourth ports of the first and second phase shift means, and supplying the output signals of the first phase shift means to first and second ports of a five port mixer means, supplying the output signals of the second phase shift means to third and fourth ports of the five port mixer means, and coupling an IF signal from the five port mixer means to an IF port.

An apparatus for mixing electrical signals including in combination: first four port phase shift means having a first input port, second and third output ports and a fourth input port, for receiving a first input signal of at least a single frequency at the first input port and providing first and second output signals differing in phase by 180° at the second and third output ports, second four port phase shift means having a first input port, second and third output ports and a fourth input port, for receiving the first input signal at the first input port and providing third and fourth output signals differing in phase by 180° at the second and third output ports, five port mixer means having four input ports and a central node coupled to a fifth port, the five port mixer means receiving the first and second output signals from the first phase shift means coupled to the first and second input ports of the five port mixer means and the third and fourth output signals from the second phase shift means coupled to the third and fourth ports of the five port mixer means, third phase shift means having a first input port, second and third output ports, and a fourth input port, for receiving a second input signal at the first input port of at least a second frequency and providing fifth and sixth output signals differing in phase by 180° at the second and third output ports, the fifth and sixth signals coupled to fourth ports of the first and second phase shift means, and IF port means coupled to the central node of the five port mixer means.

The foregoing method and means provides an output IF signal with reduced RF and LO oscillator feedthrough, and greatly improved RF to LO port isolation.

BRIEF DESCRIPTION OF THE DRAWINGS

FIG. 4 is a schematic diagram of a phase shift network including filter means in accordance with the present invention;

FIG. 5 is a schematic diagram of a circuit for realizing the circuit of FIG. 4 in MMIC form, in accordance with the present invention.

DETAILED DESCRIPTION OF THE DRAWINGS

Figure 3:
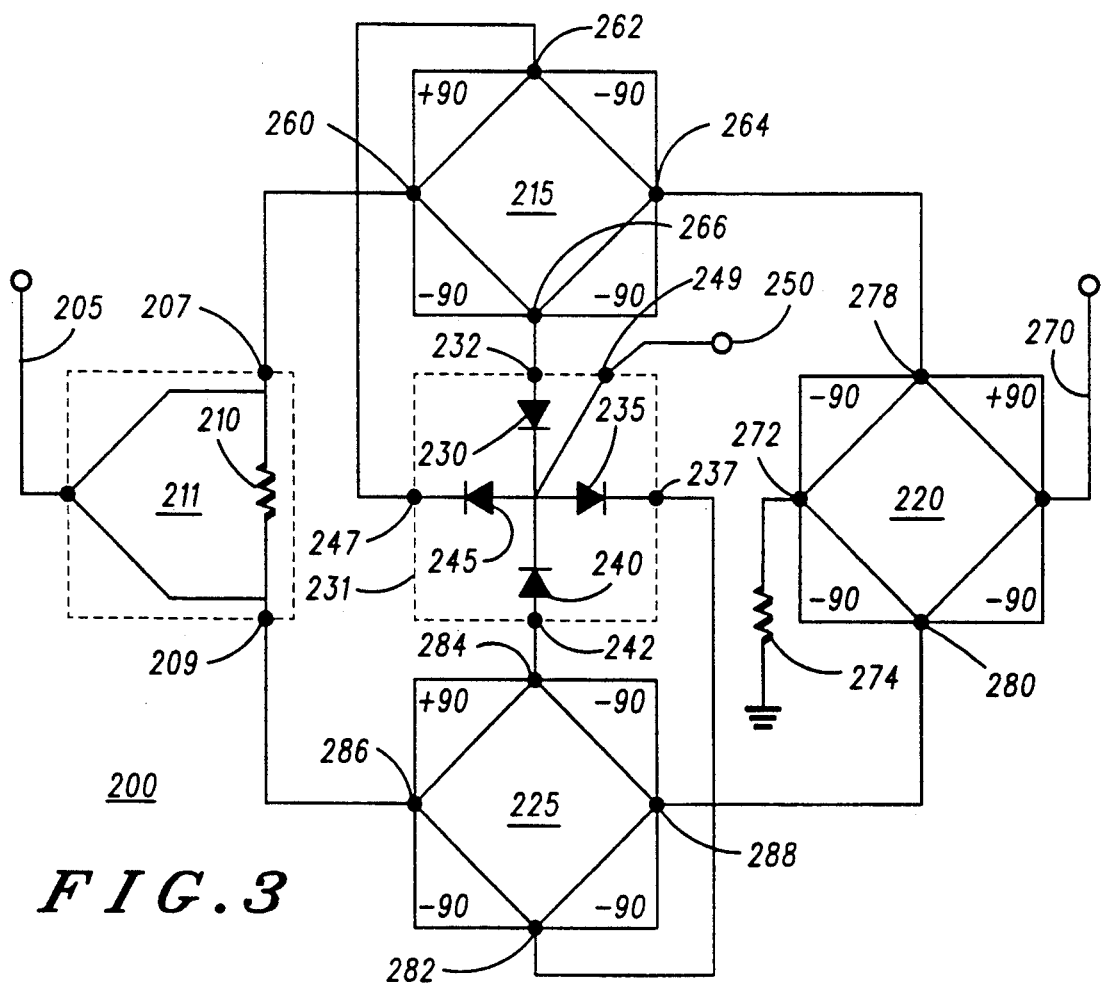
FIG. 3 is a schematic diagram of a high isolation mixer circuit in accordance with a preferred embodiment of the present invention.

FIG. 3 is a simplified schematic diagram of improved mixing apparatus 200 according to a preferred embodiment of the present invention. Apparatus 200 comprises first, second, and third phase shift means 215, 225, and 220. Each phase shift means is shown as a square with an inscribed diamond whose sides represent different paths between ports of the phase shift means. The number adjacent each path identifies the relative phase shift along that path. For example, as a portion of a signal incident upon port 286 of second phase shift means 225 passes through the "+90" path to port 284, it undergoes a relative phase shift of +90°, while the remainder of the signal energy passing through the "−90" path to port 282 and undergoing a relative phase shift of −90°, with the result that signals emergent from ports 282 and 284 of second phase shift means 225 have a net or relative phase difference of 180°. Those of skill in the art will understand that phase shift amounts indicated on the phase shift symbols are relative phase shift amounts and not absolute phase shift amounts. Those of skill in the art will also recognize that while a given port may have a designation of input or output or both in a given modulation or demodulation application of mixing apparatus 200, any port of phase shift means 215, 220, 225 can function as an input or as an output or as both simultaneously. Where fewer than four ports of a four port phase shift means are used, it is conventional to couple the "isolation" port, e.g., port 272 of third phase shift means 220, to ground via isolation resistor 274 as shown in FIG. 3. Isolation resistor 274 provides a means for dissipating the energy of common mode signals incident on ports 280, 278.

Mixing apparatus 200 further comprises RF port 205, power splitter means 211 containing isolation resistor 210 and having output ports 207, 209 and five port mixer element 231 having diodes 230, 235, 240, 245, and ports 232, 237, 242, 247, 249. First phase shift means 215 has ports 260, 262, 264, 266, second phase shift means 225 has ports 282, 284, 286, 288, and third phase shift means 220 has ports 270, 272, 278, and 280. LO port 270 and IF port 250 are also provided. IF port 250 is coupled to the common node of five port mixer element 231 via output port 249.

Diodes 230, 235, 240, 245 are conveniently arranged in a star-like configuration, that is, four diodes connected to a common (fifth) node. It is preferred to have two diodes with cathodes connected to the common node and two diodes with anodes connected to the common node.

An RF (or LO) signal is coupled to power splitter means 211 which provides substantially equal amplitude RF (or LO) signals at ports 207, 209 which are in phase with each other. Signals from port 207 of power splitter means 211 are coupled to port 260 of first phase shift means 215 and signals from port 209 of power splitter means 211 are coupled to port 286 of second phase shift means 225.

Alternative types of power splitters known in the art can be employed in place of power splitter means 211, which may be a Wilkinson power divider, for example.

An LO (or RF) signal is coupled to port 270 and thence to third phase shift means 220 which provides substantially equal amplitude LO (or RF) signals at ports 278, 280 differing in phase by substantially 180°. Signals appearing at port 278 of third phase shift means 220 are sent to port 264 of first phase shift means 215 and signals from port 280 of third phase shift means 220 are sent to port 288 of second phase shift means 225.

Ports 262, 266 of first phase shift means 215 supply signals to ports 247, 232 of five port mixer means 231. Ports 282, 284 of second phase shift means 225 supply signals to ports 237, 242 of five port mixer means 231. This is performed in such a way that signals from port 205 are applied to ports 232, 237 with a 180° phase shift relative to signals from port 205 supplied to ports 242, 247 of five port mixer means 231. Signals derived from LO port 270 are delivered to ports 232, 247 with a 180° phase shift relative to signals from port 270 supplied to ports 237, 242 of five port mixer means 231. This results in an IF frequency signal appearing at central node 249 of five port mixer means 231, due to the nonlinear voltage versus current characteristics of diodes 230, 235, 240, 245. This IF signal is coupled from node 249 to IF output port 250.

Because the signals from port 205 are delivered to five port mixer element 231 such that they are 180° out of phase, their contributions to signals appearing at port 250 cancel, resulting in improved isolation of IF port 250 from RF port 205. Any residual signals from port 205 are further dissipated in isolation resistor 274 of third phase shift means 220. Similarly, signals originating at LO port 270 substantially cancel in passing through first and second phase shift means 215, 225 with any residual signal dissipated in isolation resistor 210 and so do not appear at RF port 205, and vice versa. This is advantageous in that radio frequency receivers employing such mixers can avoid radiating LO signal power with little or no need for incorporation of additional filtering.

A further advantage of the invented arrangement is that only one type of phase shift means is needed. Phase shift means 215, 220, 225 can all be identical. This greatly simplifies construction of mixing apparatus 200.

The teachings of U.S. Pat. No. 5,023,576 "Broadband 180 degree hybrid," issued to J. Staudinger and W. L. Seely, are hereby incorporated by reference.

FIG. 4 represents a convenient method for realizing first, second, and third phase shift means 215, 225, 220 depicted in FIG. 3. FIG. 4 schematically illustrates a phase shifting network 420 comprising low pass filter 422 and high pass filter 424 coupled to a first input port 401, with low pass filter 422 further coupled to output 402 and high pass filter 426, and high pass filter 424 further coupled to output 403 and high pass filter 428. High pass filters 426 and 428 are further coupled to second input port 404, which is opposed to first input port 401.

FIG. 5 provides a schematic diagram of a lumped-element realization of the functions shown in FIG. 4. FIG. 5 illustrates L-C phase shifting network 420 comprising fourth order low pass filter 522 and fourth order high pass filter 524 coupled to a first input port 401, with fourth order low pass filter 522 further coupled to first output port 402 and fourth order high pass filter 526, and fourth order high pass filter 524 further coupled to second output port 403 and fourth order high pass filter 528. Fourth order high pass filters 526 and 528 are further coupled to second input port 404, which is opposed to first input port 401. For example, filters 522, 524, 526, 528 of FIG. 5 correspond to filters 422, 424, 426, and 428 of FIG. 4. The correspondence between phase shift network 420 and, for example, phase shift means 215 of FIG. 3 is as follows: port 401 corresponds to port 260, port 402 corresponds to port 262, port 403 corresponds to port 266, and port 404 corresponds to port 264.

Figure 2:
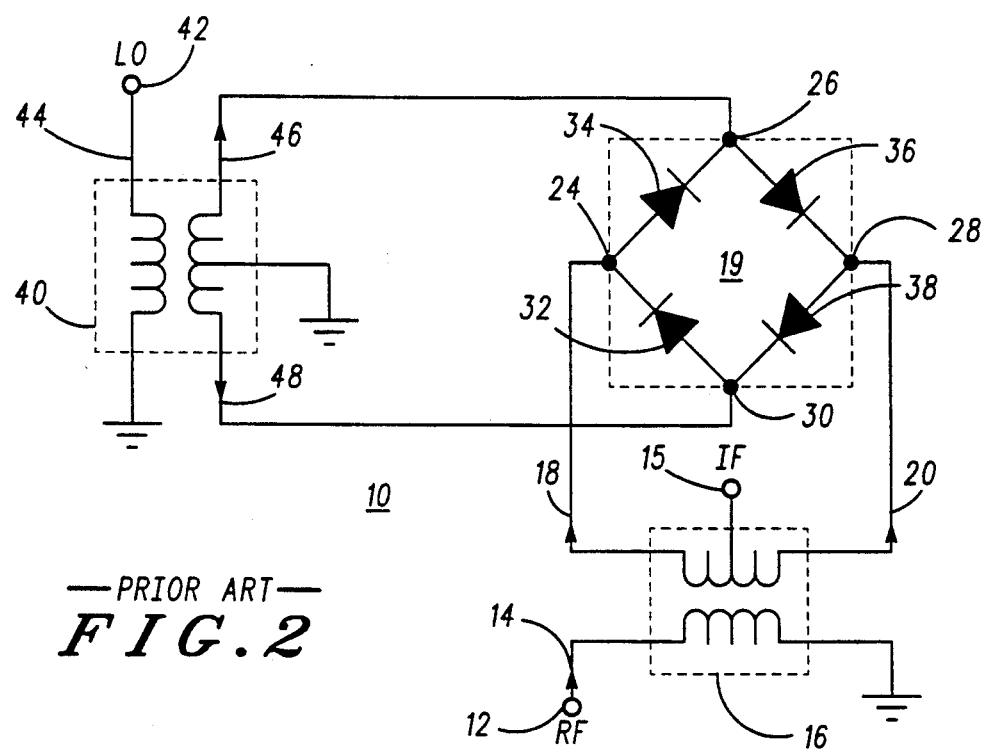
FIG. 2 is a simplified schematic representation of a double balanced mixer apparatus, according to the prior art.

Such an implementation provides substantial size reduction compared to prior art mixer apparatus 10, illustrated in FIG. 2. Balun transformers 16, 40 shown schematically in the prior art of FIG. 2 are difficult to manufacture monolithically and typically consist of a sintered ferromagnetic powder core with windings composed of enamel-insulated wire. This combination results in balun transformer 16, 40 assemblies which are at least several millimeters on a side and which must be individually placed and then soldered to a circuit board to form mixer apparatus 10. The size of both balun transformers is further increased by the bandwidth requirements imposed by supporting the RF, LO and IF frequencies. Lumped element circuits as depicted in FIG. 5 are easily mass produced by photolithographic techniques well known in the art. These lumped elements are typically a fraction of a millimeter on a side and are formed already interconnected to one another, reducing assembly labor.

Inductors, capacitors and resistors such as are illustrated in FIGS. 3 and 5 may be readily fabricated using IC process techniques in a manner compatible with MMIC's. This allows phase shift means, filters, and power splitter means to be incorporated into circuits realized in this fashion. For example, resistors are formed from polycrystalline or single crystal semiconductor regions of various doping or by using thin film materials, as for example, NiCr, TiW, TaN, and the like. Capacitors are formed using metal layers or semiconductor layers or a combination thereof spaced apart by dielectrics otherwise available during IC fabrication, as for example, $SiO$, $SiO_2$, $Si_3N_4$, or combinations thereof. Inductors are formed using metal regions of spiral shape and/or other geometries well known in the art. Al and Au are non-limiting examples of metals commonly used for conductors in IC's. Means and methods for fabricating such conductor, resistor, capacitor and/or inductor elements using the same techniques employed in IC fabrication are well known in the art.

Figure 1:
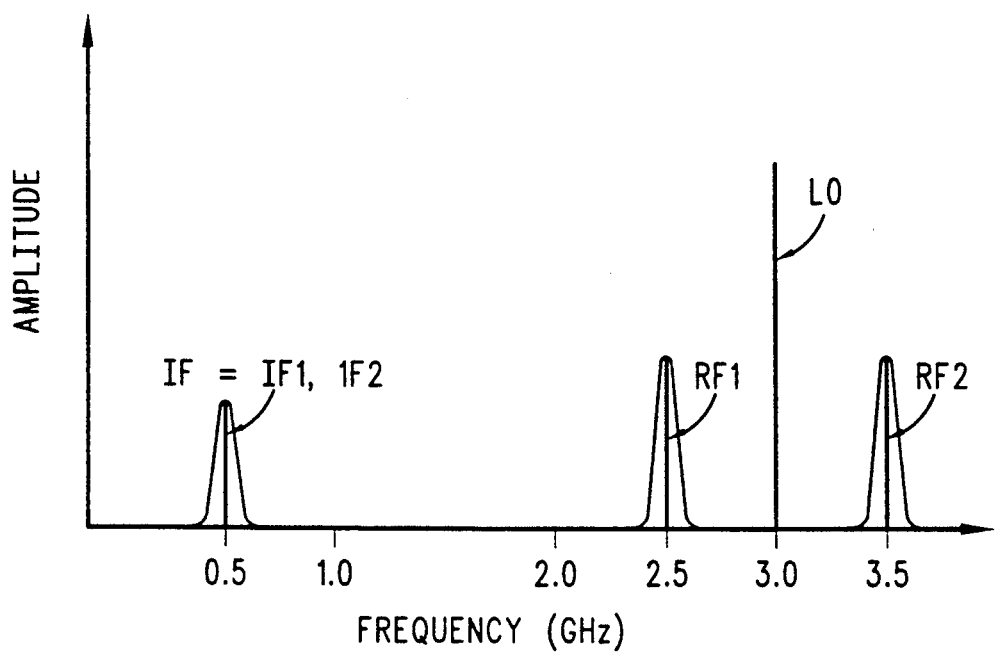
FIG. 1 is a simplified representation of RF, LO, and IF signals of different frequencies showing how RF signals RF1, RF2 are related in frequency to IF signals IF1, IF2.
Figure 6:
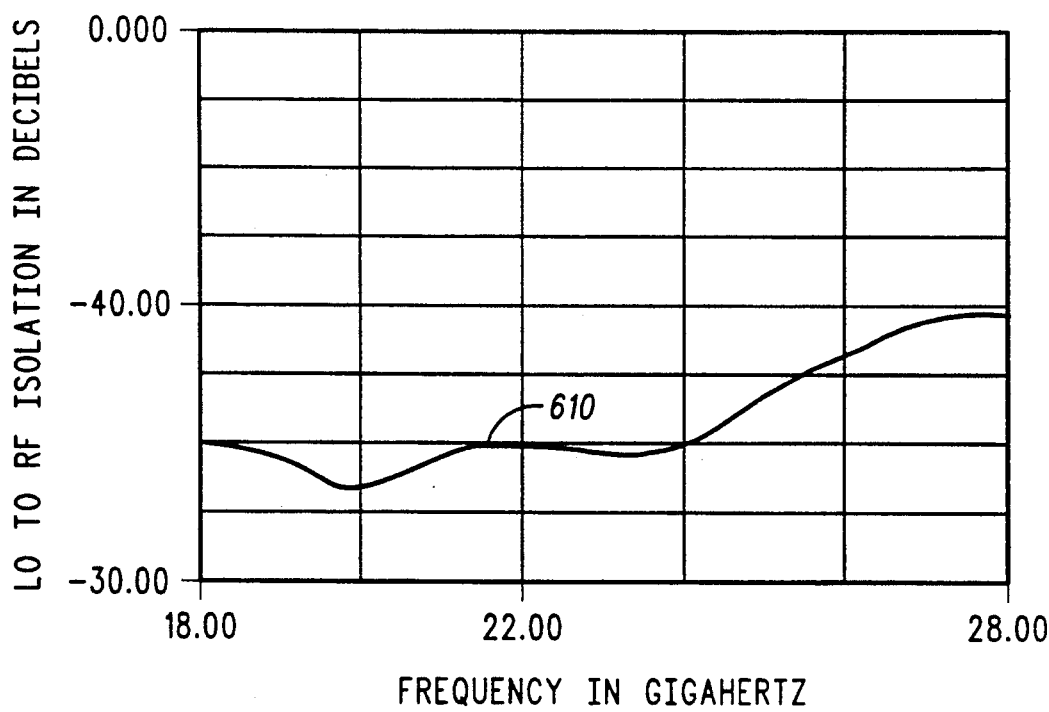
FIG. 6 is a graphical representation of the predicted coupling of signals from LO port to RF port.

FIG. 6 is a graph of predicted LO to RF isolation versus frequency performance of the mixer arrangement of FIG. 3 obtained by computed circuit modelling using methods well known in the art. The LO port to RF port isolation is shown as a curve 610, projecting isolation as exceeding 60 dB from 18 to 23 GigaHertz and not being worse than 40 dB between 18 and 28 GigaHertz. By comparison, typical prior art mixers achieve 20 to 30 dB of isolation.

This port-to-port isolation depends on first, second and third phase shift means 215, 225, 220 in FIG. 3 being well matched and producing the indicated relative phase differences. Accuracy of performance of first, second and third phase shift means 215, 225, 220 is important in achieving the advantages of the present invention. Such accuracy is promoted through use of MMIC fabrication technology for realization of mixing apparatus 200. Further, the internal paths within all three phase shift means should be well matched and as close as is reasonably possible to the indicated +/−90° relative phase shift.

A method for mixing a first input signal having a first frequency and a second input signal having a second frequency to produce a third signal having a third frequency comprising the steps of: (1) coupling said first input signal to a first four port phase shift means having a first input port, second and third output ports and a fourth input port, for providing first and second output signals differing in phase by 180°, (2) coupling said first input signal to a second four port phase shift means having a first input port, second and third output ports and a fourth input port, for providing third and fourth output signals differing in phase by 180°, (3) supplying first and second output signals from said second and third output ports of said first phase shift means to first and second input ports of a five port mixer means having four input ports and a central node coupled to a fifth port, (4) supplying third and fourth output signals from said second and third output ports of said second phase shift means to third and fourth input ports of said five port mixer means, (5) coupling said second input signal to a third phase shift means having a first input port, second and third output ports and a fourth input port, for providing fifth and sixth output signals differing in phase by 180°, (6) coupling fifth and sixth output signals from said third four port phase shift means having substantially 180° phase differences to fourth ports of said first and second phase shift means, and (7) coupling said third signal from said central node of said five port mixer means to a further external port.

It is desirable but not essential that the method also include the step of splitting said first input signal with a power splitter means to provide said first input signals having substantially the same phase.

It is desirable but not essential that the method also include the step of splitting said first input signal into first input signals having substantially the same amplitude.

It is desirable but not essential that the method also include the step of supplying signals to a five port star diode mixer element.

It is desirable but not essential that the method also include the step of supplying signals having substantially the same amplitude.

It is desirable but not essential that the method also include the step of coupling fifth and sixth output signals from said third phase shift means having substantially equal amplitudes to fourth ports of said first and second phase shift means.

Based on the foregoing description, it will be apparent to those of skill in the art that the present invention provides an improved means and method for a high isolation mixer which employs comparatively few components, which further may utilize a plurality of similar elements and so a minimum number of unique elements, which does not require strip lines and which employs lumped components most or all of which are readily fabricated on and/or in MMIC's with IC compatible technology. MMIC circuit implementations provide the advantages of small size, low weight, attractive high frequency performance, low noise figure, and reduced parts count for electronic systems.

While the present invention has been described in terms of particular arrangements, elements and methods, these are for convenience of explanation and not intended to be limiting. As those of skill in the art will understand based on the description herein, the present invention applies to other arrangements, choices of materials and elements and other methods which accomplish substantially the same result in substantially the same way, and it is intended to include in the claims that follow, these and other variations as will occur to those of skill in the art based on the present disclosure.

What is claimed is:

1. An apparatus for mixing electrical signals including in combination:

first four port phase shift means having a first input port, first and second output ports and a second input port, for receiving a first input signal at said first input port and providing first and second output signals differing in phase by 180 degrees at said first and second output ports, respectively;

second four port phase shift means having a first input port, first and second output ports and a second input port, for receiving the first input signal at said first input port of said second phase shift means and providing third and fourth output signals differing in phase by 180 degrees at aid first and second output ports of said second phase shift means, respectively;

five port mixer means having four input ports and a central node coupled to a fifth port, said five port mixer means for receiving said first and second output signals from said first phase shift means coupled to said first and second input ports of said five port mixer means and said third and fourth output signals from said second phase shift means coupled to said third and fourth ports of said five port mixer means;

third four port phase shift means having a first input port, first and second output ports and a second input port, for receiving a second input signal of at least a second input signal frequency at said first input port of said third phase shift means and providing fifth and sixth output signals differing in phase by 180 degrees at said second and third output ports, respectively, said fifth and sixth signals coupled to said second input ports of said first and second phase shift means, respectively; and signal port means coupled to said central node of said five port mixer means for providing a third signal containing modulation products of the first and second input signals.

2. Apparatus as claimed in claim 1, wherein said apparatus for mixing electrical signals further includes power splitter means coupled to said first signal, said power splitter means providing two further signals having equal amplitude and phase, said two further signals each being coupled to one of said first input ports of said first and second four port phase shift means.

3. Apparatus as claimed in claim 1, wherein said first, second, and third phase shift means comprise monolithic lumped element circuits.

4. Apparatus as claimed in claim 3, wherein said monolithic lumped element circuits comprise filter means.

5. Apparatus as claimed in claim 1, wherein said first, second, and third four port phase shift means provide output signals having equal amplitudes.

6. Apparatus as claimed in claim 1, wherein said five port mixer means comprises five port diode star mixer means.

7. Apparatus as claimed in claim 1, wherein said first, second, and third phase shift means comprise filter means.

8. Apparatus as claimed in claim 1, wherein said first, second, and third phase shift means are identical.

9. Apparatus as claimed in claim 8, wherein said identical phase shift means are formed as part of a monolithic microwave integrated circuit.

10. Apparatus as claimed in claim 9, wherein said five port mixer means comprises four monolithic diodes connected in star configuration.

11. A method for mixing a first input signal having a first frequency and a second input signal having a second frequency to produce a third signal having a third frequency, the method comprising the steps of:

coupling said first input signal to a fist input port of a first four port phase shift means having a first and second output ports and a second input port, for providing first and second output signals differing in phase by 180 degrees at said second and third output ports, respectively;

coupling said first input signal to a fist input port of a second four port phase shift means having a first and second output ports and a second input port, for providing third and fourth output signals differing in phase by 180 degrees at said first and second output ports of said second four port phase shift means, respectively;

supplying first and second output signals from said first and second output ports of said first phase shift means to first and second input ports of a five port mixer means having four input ports and a central node coupled to a fifth port;

supplying third and fourth output signals from said first and second output ports of said second phase shift means to third and fourth input ports of said five port mixer means;

coupling said second input signal to a fist input port of a third phase shift means having second and third output ports and a fourth input port, for providing fifth and sixth output signals differing in phase by 180 degrees at said second and third output ports, respectively;

coupling said fifth and sixth output signals from said third four port phase shift means to said second input ports of said first and second phase shift means; and coupling said third signal from said central node of said five port mixer means to a further external port.

12. The method as claimed in claim 11 wherein said steps of coupling a first input signal further includes the step of splitting said first input signal with a power splitter means to provide said first input signals having the same phase.

13. The method as claimed in claim 12 wherein said step of splitting includes the step of splitting said first input signal into first signals having the same amplitude.

14. The method as claimed in claim 11 wherein said supplying steps comprise supplying signals to a five port star diode mixer element.

15. The method as claimed in claim 11 wherein said supplying steps include the step of supplying signals having the same amplitude.

16. The method as claimed in claim 11 wherein said step of coupling fifth and sixth output signals from said third phase shift means to fourth ports of said first and second phase shift means includes the step of coupling fifth and sixth output signals from said third phase shift means having equal amplitudes to fourth ports of said first and second phase shift means.

17. An apparatus for mixing electrical signals, said apparatus including in combination:

a first phase shifter having a first, second, third and fourth ports, said first phase shifter for both splitting and combining various signals with appropriate phase shifts, said first port for providing a first final modulated RF output signal, said second and third ports for receiving first and second components of said modulated RF signal and providing said first and second components to said first port with a 180° phase shift therebetween, said fourth port for receiving a local oscillator signal and providing first and second local oscillator output signals therefrom;

a second phase shifter having a first, second, third and fourth ports, said second phase shifter for both splitting and combining various signals with appropriate phase shifts, said first port for providing a second final modulated RF output signal, said second and third ports for receiving third and fourth components of said modulated RF signal and providing said third and fourth components to said first port with a 180° phase shift therebetween, said fourth port for receiving said local oscillator input signal and providing third and fourth local oscillator output signals therefrom;

a third phase shift having a first isolation port, second and third output ports, and a fourth input port, said third phase shifter for splitting said local oscillator signal into first and second local oscillator signal components with a 180° phase shift therebetween, said first isolation port for isolating said fourth input port from common mode components of signals present at said second and third output ports, said second and third ports for providing first and second components of said local oscillator signal to said fourth ports of said first and second phase shifters, said fourth input port of said third phase shifter for receiving said local oscillator signal and providing said first and second local oscillator signal components to said second and third output ports;

a mixer having first, second, third and fourth ports and a fifth input port, said mixer for mixing said first, second, third and fourth local oscillator output signals with a modulating signal to provide said first, second, third and fourth modulated RF output signal components, said first, second, third and fourth ports for receiving said first, second, third and fourth local oscillator output signals from said second and third ports of said first and second phase shifters, said fifth input port for receiving said modulated signal; and an RF output port for combining said first and second final modulated RF output signals and transmitting a combined final modulated RF output signal to external apparatus.

18. A mixer apparatus as claimed in claim 17, wherein said mixer further comprises monolithic microwave integrated circuitry.

19. A mixer apparatus as claimed in claim 18, wherein said mixer further comprises a five port diode star mixer.

20. A mixer apparatus as claimed in claim 17, wherein said first, second and third phase shifters comprise lumped element monolithic microwave integrated circuitry.

21. A mixer apparatus as claimed in claim 20, wherein said lumped element monolithic microwave integrated circuitry includes a semiconductor substrate.

22. A mixer apparatus as claimed in claim 20, wherein said lumped element monolithic microwave integrated circuitry comprises inductor-capacitor filters.

23. A mixer apparatus as claimed in claim 17, wherein said first, second and third phase shifters provide output signals of equal amplitude.

* * * * *

UNITED STATES PATENT AND TRADEMARK OFFICE
CERTIFICATE OF CORRECTION

PATENT NO. : 5,303,418
DATED : April 12, 1994
INVENTOR(S) : Joseph Staudinger et al.

It is certified that error appears in the above-indentified patent and that said Letters Patent is hereby corrected as shown below:

Column 8, claim 1, line 6, change "aid" to --said--.

Column 9, claim 11, line 5, change "fist" to --first--.

Column 10, claim 17, line 4, change "ports" to --port--.

Column 10, claim 17, line 15, change "shift" to --shifter--.

Signed and Sealed this

Fifteenth Day of November, 1994

Attest:

BRUCE LEHMAN

*Attesting Officer*  *Commissioner of Patents and Trademarks*